United States Patent [19]
Johnson

[11] 4,385,234
[45] May 24, 1983

[54] OPTICAL SYSTEMS FOR OPTICAL ENCODERS

[75] Inventor: Paul A. Johnson, Santa Barbara, Calif.

[73] Assignee: BEI Electronics, Inc., Little Rock, Ak.

[21] Appl. No.: 210,162

[22] Filed: Nov. 25, 1980

[51] Int. Cl.³ .............................................. G01D 5/34
[52] U.S. Cl. ............................. 250/231 SE; 250/216
[58] Field of Search ............ 250/216, 231 SE, 237 G, 250/239; 356/39 S; 340/347 P

[56] References Cited
U.S. PATENT DOCUMENTS

| | | | |
|---|---|---|---|
| 4,039,826 | 8/1977 | Wingate | 250/239 |
| 4,047,586 | 9/1977 | Dlugos | 250/237 G |
| 4,221,328 | 9/1980 | Kramer | 340/347 P |

*Primary Examiner*—David C. Nelms
*Attorney, Agent, or Firm*—Burmeister, York, Palmatier, Hamby & Jones

[57] ABSTRACT

An optical system for an optical encoder of the type having an optical code disc with a plurality of code tracks, and a multichannel photodetector for receiving modulated light from the code tracks, the optical system comprising a light source for producing a line of light, an optional collimating lens for receiving divergent rays of light from said light source and for directing the light in generally parallel rays toward the code disc, an objective lens disposed between the collimating lens and the code disc for focussing the light in a sharp line on the code disc, a housing for supporting the collimating lens and having a seat for receiving the objective lens, an aperture plate having an aperture slit therein aligned with the objective lens, and means for holding the aperture plate on the housing with the objective lens retained between the seat and the plate. Flanges may be provided on the housing to retain the aperture plate, preferably in a flexed position in engagement with the objective lens, which may be cylindrical, semicylindrical, or in the form of a doublet or a triplet. A grating may be substituted for the plate and the objective lens. In an alternative construction, the aperture plate may be molded into a cylindrical objective lens.

24 Claims, 16 Drawing Figures

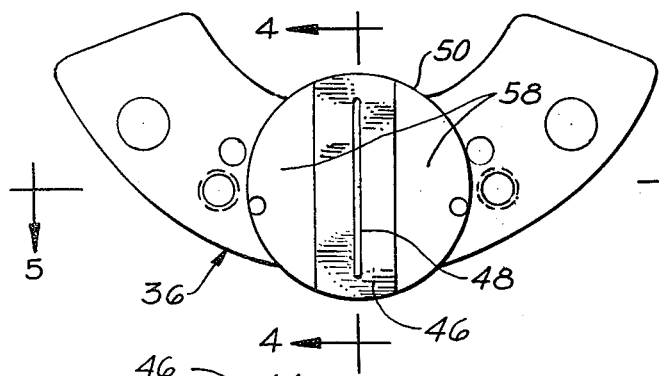
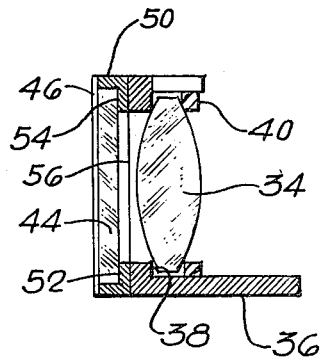
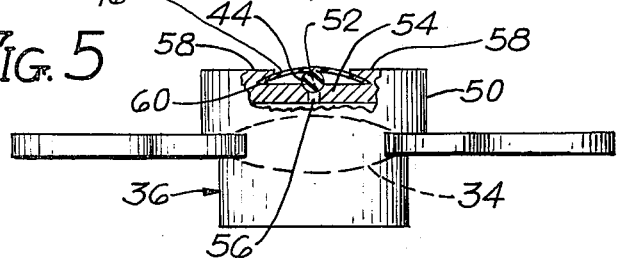
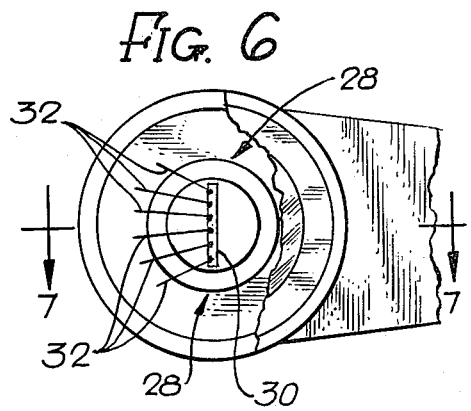
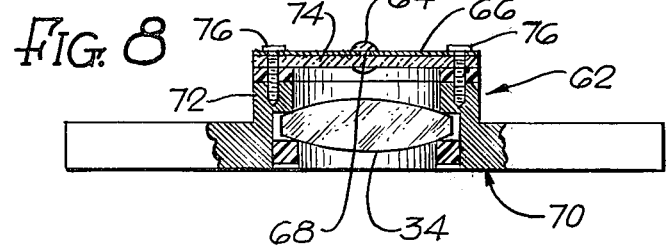
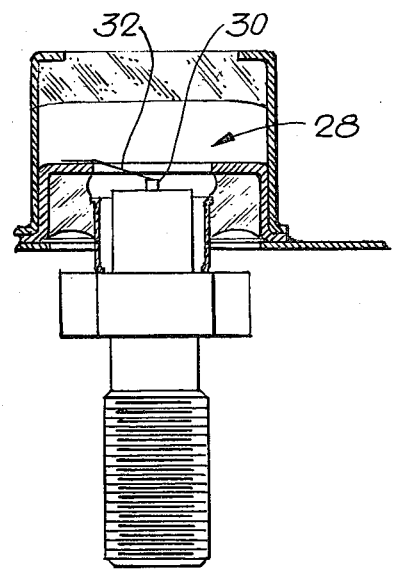

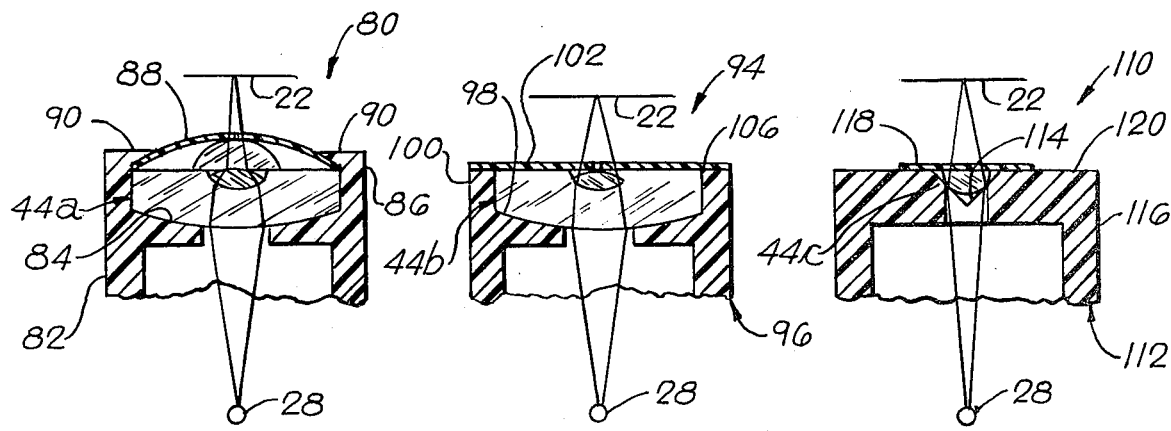
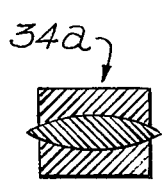
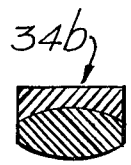
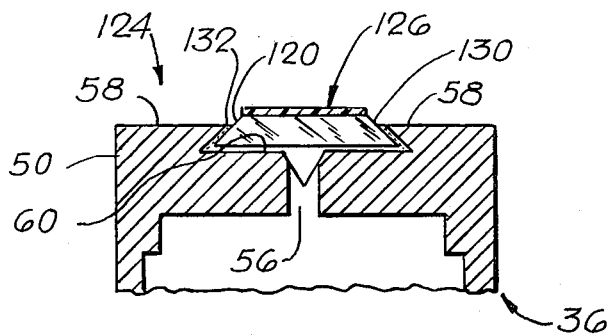
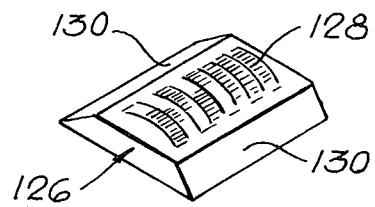

OPTICAL SYSTEMS FOR OPTICAL ENCODERS

BACKGROUND OF THE INVENTION

This invention relates to optical encoders of the type having a rotary code disc, or some other movable code member, having a plurality of optical code tracks for modulating light in accordance with the position or movement of the code member. Such an optical encoder includes an optical system for illuminating the code tracks on the movable code member, and for directing the modulated light from the code tracks to a photodetector having a plurality of channels for converting the modulated light into corresponding electrical signals.

OBJECTS OF THE INVENTION

One object of the present invention is to provide a new and improved optical system for an optical encoder of the foregoing character.

A further object is to provide such a new and improved optical system which is constructed and arranged so that the various components of the optical system may be easily assembled and will be automatically held in the correct relationship, without any necessity for a delicate or difficult adjustment of the optical system.

SUMMARY OF THE INVENTION

To achieve these and other objects, the present invention preferably provides an optical system for an optical encoder, comprising a multitrack optical code member, a multichannel photodetector for receiving modulated light from the code member, a light source to provide light for illuminating the code member, an objective lens for focussing a line of light on the code member, a housing having a seat for receiving the objective lens, an aperture plate having an aperture therein aligned with the objective lens, and holding means for holding the aperture plate on the housing with the lens retained between the plate and the seat.

The objective lens may be generally cylindrical, semicylindrical, or in any other known or suitable form, such as a doublet or a triplet.

The holding means may comprise flange means on the housing for holding the aperture plate with the lens retained between the plate and the seat. The aperture plate may be flexible and resilient and may be held by the flange means in a flexed position with the plate engaging the lens and resiliently pressing the lens against the seat.

The seat may be in the form of a groove in the housing for receiving and locating the objective lens, particularly when such lens is cylindrical.

The holding means may include a dovetail channel in the housing for slidably receiving and retaining the aperture plate.

The optical system may include a collimating lens disposed between the light source and the objective lens. The collimating lens may include at least one optical element with generally spherical curvature. The collimating lens may include a single optical element or doublet or triplet optical elements. The collimating lens may include an aspheric optical element.

The holding means may include adhesive means for holding the aperture plate on the housing.

The light source may include a light emitting diode, preferably constructed to produce light in a line pattern.

In one embodiment, the aperture plate may be molded into the objective lens.

The optical system may include a housing having a transversely extending dovetail mounting channel therein, and an optical modification device mounted in the dovetail channel for modifying the light supplied to the code member. The optical modification device may comprise an optical grating, or an objective lens and an aperture plate mounted together in the dovetail channel.

BRIEF DESCRIPTION OF THE DRAWINGS

Further objects, advantages and features of the present invention will appear from the following description, taken with the accompanying drawings, in which:

FIG. 3 is an elevational view showing the lens housing and the aperture plate, taken generally as indicated by the line 3—3 in FIG. 1.

FIG. 4 is a sectional view, taken generally along the line 4—4 in FIG. 3.

FIG. 5 is a plan view, partly in section along the line 5—5 in FIG. 3.

FIG. 6 is a fragmentary elevation showing the light source, the view being taken generally as indicated by the line 6—6 in FIG. 1.

FIG. 7 is a sectional view, taken generally along the line 7—7 in FIG. 6.

FIG. 8 is a view somewhat similar to FIG. 5, but showing a modified construction.

FIG. 9 is a fragmentary diagrammatic section showing a modified optical system having a triplet objective lens.

FIG. 10 is a fragmentary diagrammatic section showing another modified construction having a doublet objective lens.

FIG. 11 is a fragmentary diagrammatic section showing another modified construction having a generally semicylindrical objective lens.

FIGS. 12, 13 and 14 are fragmentary sections showing modified collimating lenses in the form of a triplet, an achromatic doublet, and an aspheric lens.

FIG. 15 is a fragmentary diagrammatic section showing a modified construction in which a grating is substituted for the objective lens and the aperture plate shown in FIGS. 1-8.

FIG. 16 is a diagrammatic perspective view showing the grating of FIG. 15.

DETAILED DESCRIPTION OF EMBODIMENTS

Figure 1:
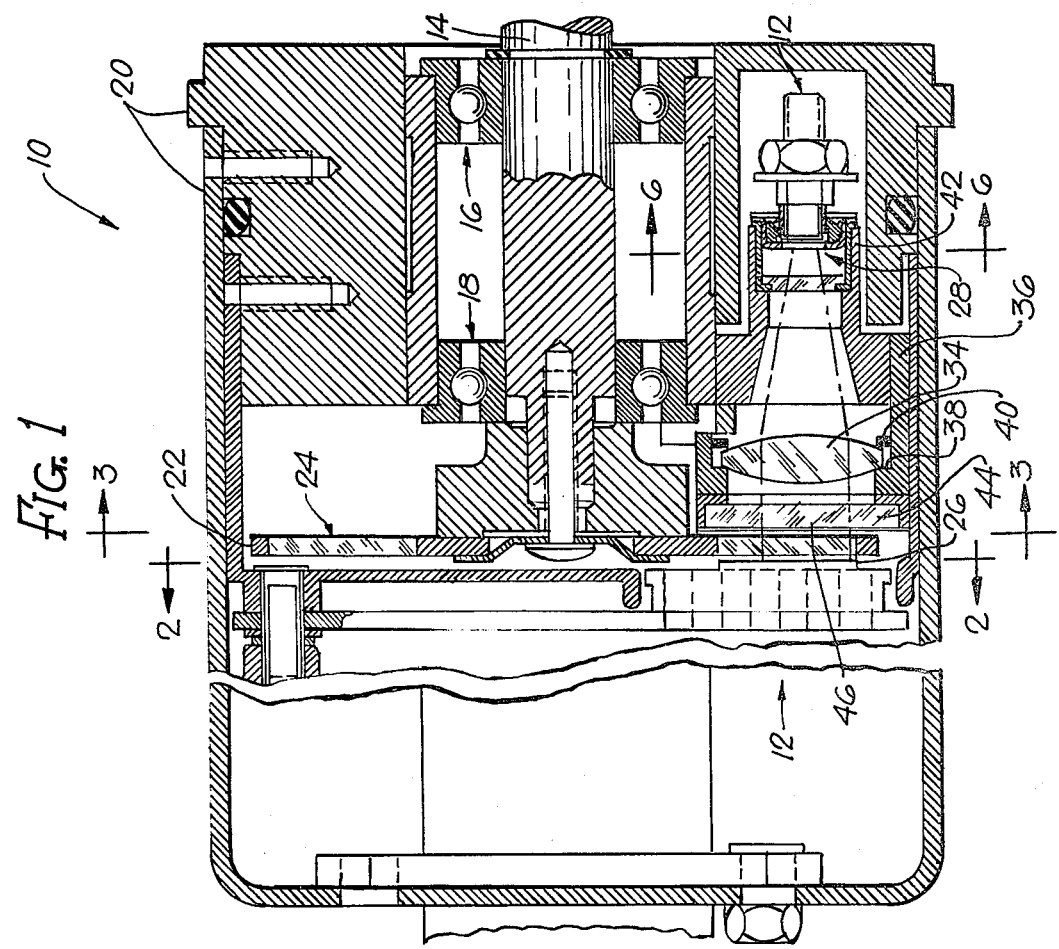
FIG. 1 is a fragmentary longitudinal section taken through an optical encoder to be described as an illustrative embodiment of the present invention, the section being taken generally along the line 1—1 in FIG. 2.
Figure 2:
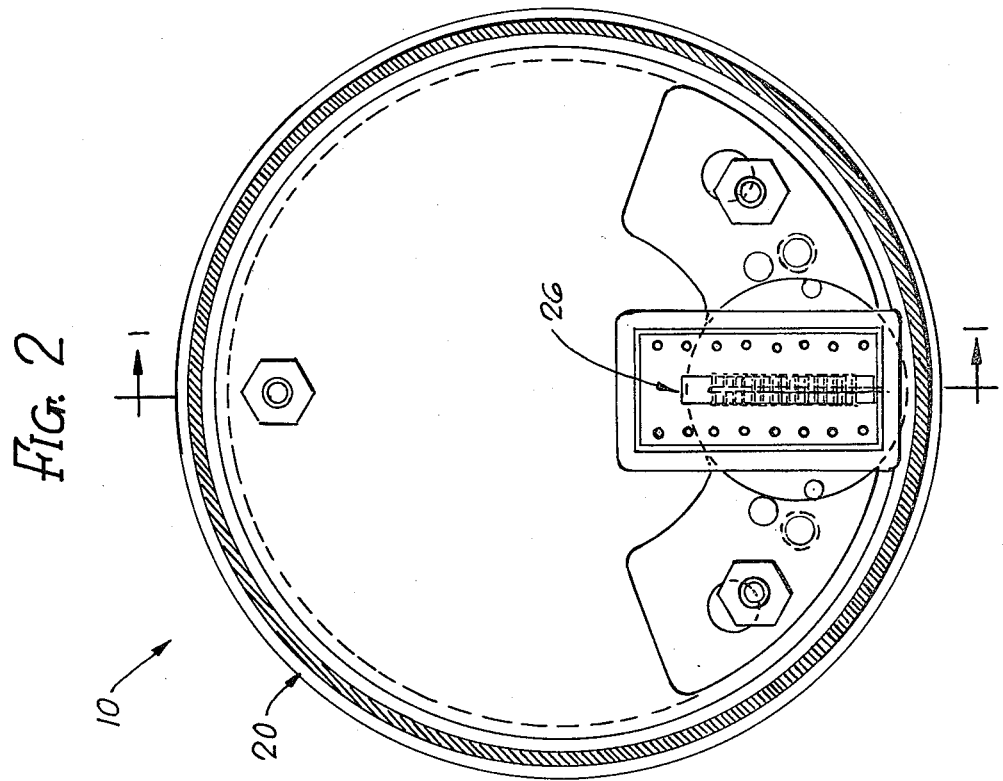
FIG. 2 is a transverse section, taken generally along the line 2—2 in FIG. 1.

As just indicated, FIGS. 1 and 2 illustrate an optical encoder 10 having an optical system 12 to be described as an illustrative embodiment of the present invention. The optical encoder 10 has a rotatable shaft 14 which is supported by bearings 16 and 18 in a main housing or frame 20. The general purpose of the encoder 10 is to provide electrical signals to indicate the position or movement of the shaft 14 with a high degree of precision. Thus, the optical encoder 10 may be used in a telemetering system for electrically monitoring the position or movement of any rotatable or translatable member, to which the shaft 14 is connected.

The optical encoder 10 has a movable code member, illustrated as an optical code disc 22, mounted on and rotatable with the mechanical input shaft 14. The optical code disc 22 may be of any known or suitable construction, and preferably is of the multitrack type, having a plurality of optical code tracks 24 for modulating light in accordance with the position or movement of the code disc. Such optical code discs are well known to those skilled in the art. For example, a typical code disc may be of the digital type, made of a transparent material, such as glass, and provided with a plurality of concentric circular tracks, each of which has successive segments which are alternately light and dark, so that incident light is modulated by the tracks when the disc is rotated. The number of segments in the successive concentric tracks may differ in accordance with a binary code. Thus, for example, the number of segments in the successive tracks may be 2, 4, 8, 16, 32 and so forth. The code disc may be arranged to either transmit or reflect light.

By way of example, such optical code discs are illustrated and described in the Brean and Stiedle U.S. Pat. No. 3,618,074, issued Nov. 2, 1971, and the Brean U.S. Pat. No. 3,710,375, issued Jan. 9, 1973, both of which are assigned to the assignee of the present invention.

As shown in FIGS. 1 and 2, the optical system 12 of the optical encoder 10 includes a multichannel photodetector 26 for converting the modulated light from the code tracks 24 into a plurality of corresponding electrical signals. As shown in FIG. 1, the multichannel photodetector 26 is positioned closely adjacent the left hand side of the optical code disc 22 for receiving the modulated light from the optical code tracks 24. The photodetector 26 may be of any known or suitable construction. Thus, for example, the photodetector 26 may employ a plurality of photoelectric elements, utilizing light sensitive silicon junctions or other means for converting light into electrical signals.

The optical system 12 includes a light source 28 for producing light to illuminate the code tracks 24 on the code disc 22. Preferably, the light source 28 is constructed and arranged to produce a line pattern of light. The illustrated light source 28 is in the form of a light emitting diode having a light emitting linear member or bar 30. Energizing currents are supplied to the linear member 30 by a plurality of leads 32, connected to a series of points along the linear member, as shown in FIGS. 6 and 7.

The optical system 12 also includes a collimating or converging lens 34, disposed between the light source 28 and the code disc 22. Generally, the lens 34 has a collimating action, in that the lens receives diverging rays of light from the light source 28 and directs the light along generally parallel rays toward the code disc 22. As shown in FIG. 1, the lens 34 is of the double convex type having spherically curved convex surfaces. However, the collimating lens may be of any known or suitable type having one or more lens elements. Thus, FIGS. 12, 13 and 14 show modified types of collimating lenses. FIG. 12 shows a triplet collimating lens 34a having three lens elements. FIG. 13 shows an achromatic doublet collimating lens 34b having two lens elements. FIG. 14 shows an aspheric collimating lens 34c. These lenses are shown by way of example, and not by way of limitation. It is also possible to dispense with the collimating lens, although better results are generally obtained with the use of the lens.

As shown in FIG. 1, the collimating lens 34 is mounted and supported in a lens housing 36 which is suitably supported within the main or outer housing 20 of the optical encoder 10. As shown, the lens housing 36 has a circular seat 38 for receiving and locating the lens 34. A retaining ring 40 is mounted in the lens housing 36 to hold the lens 34 against its seat 38. It will be seen that the light source 28 is received and supported within a tubular component 42 of the lens housing 36. In this way, the light source is automatically located and supported along the optical axis of the converging lens 34.

As shown in FIG. 1, the optical system 12 also includes an objective lens 44 for focussing a line of light upon the code tracks 24 on the code disc 22. The objective lens 44 is also mounted in the lens housing 36 and is accurately located and disposed between the collimating lens 34 and the code disc 32. The objective lens 44 is closely spaced from the code disc 22 and is mounted along the optical axis of the collimating lens 34.

As shown in FIG. 1, the objective lens 44 is generally cylindrical and is specifically in the form of a transparent cylindrical rod, having a cylindrical axis which is parallel with the linear light emitting member 30 of the light source 28. However, the objective lens 44 may assume various other forms, some of which are illustrated by way of example in FIGS. 9, 10 and 11. FIG. 9 shows a modified objective lens 44a which is in the form of a triplet, having three lens elements. Generally, the lens elements have one or two optical surfaces which are generally cylindrical in curvature.

FIG. 10 shows another modified objective lens 44b which is in the form of a doublet having two lens elements with optical surfaces having generally cylindrical curvature.

FIG. 11 shows another modified objective lens 44c which is generally semicylindrical. Further details of FIGS. 9–11 will be described presently.

As shown in FIGS. 1 and 3–5, the optical system 12 includes an aperture plate or member 46, disposed between the objective lens 44 and the code disc 22. Thus, the aperture plate 46 is closely adjacent the code disc 22. The illustrated aperture plate 46 is formed with an aperture slit 48 which is aligned with the objective lens 44 and parallel with the cylindrical axis thereof. The aperture slit 48 assists in defining the line of light which is focussed on the code disc 22.

The objective lens 44 and the aperture plate 46 are preferably mounted on the lens housing 36 in such a manner that the positions of the objective lens 44 and the aperture plate 46 are accurately established relative to the other components of the optical system. As shown in FIGS. 3–5, the lens housing 36 has a ring-shaped front portion 50 which is formed with a seat 52, adapted to receive and locate the objective lens 44. The illustrated objective lens 44 is in the form of a cylindrical rod. The seat 52 takes the form of a linear groove, formed in the front portion 50 of the lens housing 36. The groove or seat 52 is preferably V-shaped in cross section, for accurately locating the cylindrical lens 44. The groove 52 is perpendicular to the optical axis of the collimating lens 34 and is parallel with the linear light emitting member 30 of the light source 28.

As shown in FIGS. 4 and 5, the grooves or seat 52 is formed in the front or outer side of a transverse wall 54, extending across the front portion 50 of the lens housing 36, in front of the collimating lens 34. The rear or bottom of the groove 52 communicates with a slot 56, extending through the wall 54, to transmit light between the converging lens 34 and the objective lens 44. The slot 56 is parallel with the aperture slit 48 in the aperture plate 46.

The objective lens 44 is retained between the aperture plate 46 and the seat 52. As shown in FIGS. 3-5, the aperture plate 46 is thin, flexible and resilient and preferably is in the form of a thin metal plate or sheet. However, in some cases, the aperture plate is not necessarily flexible and resilient.

In the specific construction of FIGS. 3-5, the aperture plate 46 is employed as a resilient spring member to press the objective lens 44 against its seat 52. Thus, the aperture plate 46 is mounted in the front portion 50 of the lens housing 36, with the aperture plate 46 engaging the objective lens 44, which is cylindrical in this instance. The aperture plate 46 is flexed into a curved shape, as shown in FIG. 5, so that the aperture plate 46 presses the cylindrical lens 44 against its seat 52. The aperture plate 46 is held in its curved, flexed position by flange means on the front portion 50 of the lens housing 36, such flange means being illustrated as a pair of flanges 58 overlapping the side portions of the aperture plate 46 and extending parallel with the seat 52 for the cylindrical lens 44. The illustrated flanges 58 are formed by a dovetail groove or channel 60 in the front portion 50 of the lens housing 36. The dovetail channel 60 is parallel with the seat or groove 52 which receives the cylindrical lens 44.

As shown in FIGS. 3-5, the aperture plate 46 is easy to install in the front portion 50 of the lens housing 36. This is done by positioning the cylindrical lens 44 in its seat or groove 52, following which the aperture plate 46 is flexed into a curved shape and is slid into the dovetail channel 60, so that the aperture plate 46 will engage the front side of the cylindrical lens 44. The edge portions of the aperture plate 46 are retained behind the flanges 58 formed by the dovetail channel 60.

In this way, the aperture slit 48 is automatically aligned with the cylindrical objective lens 44, which in turn is pressed into its seat or groove 52, so that the cylindrical lens is automatically located in the correct position with respect to the collimating lens 34 and the light source 28. The cylindrical objective lens 44 and the aperture slit 48 are located so that they are parallel with the linear light emitting member 30 of the light source 28.

The entire optical system 12 can be assembled very easily, yet with a high degree of accuracy, so that the relative positions of the various components of the optical system 12 are established and maintained with a high degree of precision. The optical system 12 does not require any delicate or difficult adjustments.

FIG. 8 illustrates a modified optical system 62, in which the cylindrical objective lens 44 and the aperture plate 46 of FIGS. 1-7 are replaced by a modified cylindrical lens 64 and an aperture plate 66. In this case, the aperture plate 66 is molded into the cylindrical lens 64. As shown, the aperture plate 66 has an aperture slit 68 which is embedded in the cylindrical lens 64. In this way, the alignment between the aperture slit 68 and the cylindrical lens 64 is precisely established.

In the optical system 62 of FIG. 8, the collimating lens 34 is the same as before, but is mounted in a modified lens housing 70, similar to the lens housing 36, but with a modified front portion 72 for supporting the objective lens 64 and the aperture plate 66. It will be seen that the objective lens 64 is in the form of a cylindrical focussing element or portion, holding one piece with a flat supporting or mounting plate 74, extending across the front housing portion 72, and secured thereto by screws 76 or other suitable means. The aperture plate 66 is mounted against the front side of the mounting plate 74 and is also secured to the front housing portion 72 by the screws 76.

The construction of FIG. 8 also precisely establishes and maintains the desired relationship between the collimating lens 34 and the objective lens 64, while also precisely establishing and maintaining the position of the aperture plate 66, with its aperture slit 68 aligned with the cylindrical objective lens 64. The mounting plate 74 and the cylindrical lens 64 may be molded in one piece from glass or a transparent resinous plastic material.

As previously indicated, FIG. 9 illustrates a modified optical system 80 utilizing the triplet objective lens 44a, which is mounted in a modified lens housing or holder 82 having a seat 84 in its front portion 86, for receiving and locating the triplet objective lens 44a. The seat 84 is in the form of a channel, in which the triplet lens 44a is retained by an aperture plate 88. The illustrated lens housing 82 has flange means for holding the aperture plate 88 against the front element of the triplet lens 44a, such flange means being shown in the form of a pair of flanges 90, similar to the flanges 58 of FIG. 5. The aperture plate 88 is shown as being in a curved shape, and is preferably but not necessarily flexed into such curved shape, as in the case of the aperture plate 46. The aperture plate 88 is preferably but not necessarily resilient, so that it resiliently presses the triplet lens 44a against its seat 84.

The triplet objective lens 44a of FIG. 9 focusses the light from the light source 28 into a line of light on the code disc 22. The slit in the aperture plate 88 assists in the formation of the fine line of light.

As previously indicated, FIG. 10 shows another modified optical system 94 utilizing the doublet objective lens 44b, mounted in a modified lens housing 96 having a seat or channel 98 in its front portion 100, for receiving and locating the doublet lens 44b. The optical system 94 also includes an aperture plate or member 102 which retains the doublet lens 44b against its seat 98. The aperture plate 102 is flat in this instance and is suitably held on the lens housing, as by means of cement or other adhesive means, applied between the aperture plate 102 and the corresponding front surface 104 of the lens housing 96.

As before, the doublet objective lens 44b focusses a line of light on the code disc 22, such light being derived from the light source 28. As before, the aperture plate 102 may have an aperture slit which assists in defining the fine line of light on the code disc 22.

FIG. 11 illustrates another modified optical system 110 utilizing the semicylindrical objective lens 44c, which is mounted in a modified lens housing 112 having a seat or groove 114 in its front portion 116, for receiving and locating the lens 44c. The seat or groove 114 is in the form of a generally V-shaped channel. An aperture plate or member 118 is mounted on the lens housing 112 in front of the lens 44c and is effective to retain the lens against its seat 114.

In the optical system 110 of FIG. 11, the aperture plate 118 is flat and is suitably held on the lens housing 116, as by means of cement or other adhesive means, applied between the aperture plate 118 and the corresponding front surface 120 of the lens housing 116.

The semicylindrical objective lens 44c focusses a line of light on the code disc 22, such light being derived from the light source 28. As before, the aperture plate 118 may have an aperture slit which assists in defining the fine line of light on the code disc 22.

FIGS. 15 and 16 illustrate another modified optical system 124 which may utilize the same lens housing 50 as described in connection with FIG. 5. However, in the modified optical system 124 of FIG. 15, the objective lens 44 and the aperture plate 46 are replaced by a grating 126 marked with a suitable code pattern 128. Such gratings are known to those skilled in the art. The illustrated grating 126 is in the form of a transparent plate, made of glass or some other transparent material, and shaped to fit into the dovetail groove 60, so that the grating 126 will be retained by the overhanging flanges 58. As shown in FIGS. 15 and 16, the grating 126 has slanting side surfaces 130, adapted to be slidably received under the flanges 58. The grating 126 may be suitably secured in the dovetail channel 60, as by cement 132 or other adhesive means, for example.

The lens housing 50 of FIGS. 5 and 15 has the advantage of affording a universal construction, adapted to receive and support either the grating 126 of FIG. 15, or the objective lens 44 and the aperture plate 46 of FIG. 5, either of which constitutes an optical modification device.

Various other modifications, alternative constructions and equivalents may be employed, without departing from the true spirit and scope of the present invention.

I claim:

1. An optical system for an optical encoder, comprising
a multitrack optical code member,
a multichannel photodetector for receiving modulated light from said code member,
a light source to provide light for illuminating said code member,
an objective lens for focussing a line of light on said code member,
a housing having a seat for receiving said objective lens,
an aperture plate having an aperture therein aligned with said objective lens,
and holding means for holding said aperture plate on said housing with said lens retained between said plate and said seat.

2. An optical system according to claim 1, in which said objective lens is generally cylindrical.

3. An optical system according to claim 1, in which said objective lens is generally semi-cylindrical.

4. An optical system according to claim 1, in which said objective lens comprises doublet optical elements.

5. An optical system according to claim 1, in which said objective lens comprises triplet optical elements.

6. An optical system according to claim 1, said holding means comprising flange means on said housing for holding said aperture plate with said lens retained between said plate and said seat.

7. An optical system according to claim 1, said aperture plate being flexible and resilient, said holding means comprising flange means on said housing for holding said aperture plate in a flexed position with said plate engaging said lens and resiliently pressing said lens against said seat.

8. An optical system according to claim 7, in which said objective lens is generally cylindrical.

9. An optical system according to claim 7, in which said objective lens is generally in the form of a cylindrical rod,
said seat being in the form of a groove in said housing for receiving and locating said cylindrical rod.

10. An optical system according to claim 7, in which said objective lens is in the form of a generally cylindrical member,
said seat including a groove in said housing for receiving and locating said lens,
said aperture plate being flexible and resilient,
said holding means including a dovetail channel in said housing for slidably receiving and retaining said aperture plate in a curved flexed position with said aperture plate engaging said lens and resiliently pressing said lens into said groove, said aperture plate having a slit therein aligned with said lens.

11. An optical system according to claim 1, including a collimating lens disposed between said light source and said objective lens.

12. An optical system according to claim 11, in which said collimating lens includes at least one optical element with generally spherical curvature.

13. An optical system according to claim 11, in which said collimating lens includes doublet optical elements.

14. An optical system according to claim 11, in which said collimating lens includes triplet optical elements.

15. An optical system according to claim 11, in which said collimating lens includes a aspheric optical element.

16. An optical system according to claim 1, said holding means including adhesive means for holding said aperture plate on said housing.

17. An optical system according to claim 1, in which said light source includes a light emitting diode.

18. An optical system according to claim 1, in which said light source includes a light emitting diode for producing light in a line pattern.

19. An optical system for an optical encoder,
comprising a multitrack optical code member,
a multichannel photodetector for receiving modulated light from said code member,
a light source to provide light for illuminating said code member,
an objective lens disposed between said light source and said code member for focussing a line of light on said code member,
a housing for supporting said lens,
and an aperture plate molded into said objective lens and having an aperture aligned therewith.

20. An optical system according to claim 19, in which said objective lens is generally cylindrical.

21. An optical system according to claim 19, in which said objective lens has a mounting portion and a focussing portion,
said mounting portion being mounted on said housing, said aperture plate being molded into said focussing portion.

22. An optical system according to claim 21, in which said focussing portion includes at least one optical element having a generally cylindrical curvature.

23. An optical system for an optical encoder, comprising
a multitrack optical code member,
a multichannel photodetector for receiving modulated light from said code member,
a light source to provide light for illuminating said code member,
an objective lens for focussing a line of light on said code member,
a housing having a seat for receiving said objective lens,
an aperture plate having an aperture therein aligned with said objective lens,
and holding means for holding said aperture plate on said housing with said lens retained between said plate and said seat,
said aperture plate being flexible and resilient,
said holding means including a dovetail channel in said housing for slidably receiving and retaining said aperture plate in a flexed position with said aperture plate engaging said lens and resiliently pressing said lens against said seat.

24. An optical system for an optical encoder, comprising
a multitrack optical code member,
a multichannel photodetector for receiving modulated light from said code member,
a light source to provide light for illuminating said code member,
an optical housing disposed between said light source and said code member,
said housing having a transversely extending dovetail mounting channel therein,
and an optical grating plate fitted into said dovetail channel and retained therein adjacent said code member for modifying the light supplied to said code member from said light source,
said dovetail channel forming a pair of flanges on said housing,
said flanges overlapping and retaining said grating plate,
said grating plate having a pair of slanting side surfaces engaged and retained by said flanges whereby said grating plate is retained in an established relation to said code member.

* * * * *